(12) United States Patent
Kohama

(10) Patent No.: US 11,128,297 B2
(45) Date of Patent: Sep. 21, 2021

(54) SEMICONDUCTOR INTEGRATED CIRCUIT

(71) Applicant: FUJI ELECTRIC CO., LTD., Kawasaki (JP)

(72) Inventor: Takanori Kohama, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/751,425

(22) Filed: Jan. 24, 2020

(65) Prior Publication Data
US 2020/0287538 A1    Sep. 10, 2020

(30) Foreign Application Priority Data

Mar. 7, 2019  (JP) .............................. JP2019-041694

(51) Int. Cl.
*H03K 17/73* (2006.01)
*H03K 17/082* (2006.01)
*H03K 17/74* (2006.01)

(52) U.S. Cl.
CPC ....... *H03K 17/731* (2013.01); *H03K 17/0828* (2013.01); *H03K 17/74* (2013.01)

(58) Field of Classification Search
None
See application file for complete search history.

(56) References Cited

U.S. PATENT DOCUMENTS

| 2016/0010615 A1 | 1/2016 | Ishii |
| 2017/0373583 A1 | 12/2017 | Nakajima et al. |
| 2020/0240385 A1* | 7/2020 | Ueno ........................ F02P 11/00 |

FOREIGN PATENT DOCUMENTS

| JP | 2016-017512 A | 2/2016 |
| JP | 2018-007539 A | 1/2018 |

* cited by examiner

*Primary Examiner* — Thomas J. Hiltunen
(74) *Attorney, Agent, or Firm* — Rabin & Berdo, P.C.

(57) ABSTRACT

A semiconductor integrated circuit includes a semiconductor power switch element configured to drive an inductive load, a load current sensing circuit configured to sense a load current of the inductive load, a logic circuit configured to output a logic signal responsive to the load current sensing circuit sensing a drop in the load current while the semiconductor power switch element is turned on, a gate voltage pull-down circuit configured to pull down a gate voltage of the semiconductor power switch element upon receiving the logic signal, a clamp diode disposed between a gate of the semiconductor power switch element and a high-potential terminal connected to the inductive load, and a clamp withstand voltage drop circuit configured to switch a first withstand voltage of the clamp diode to a second withstand voltage, which is lower than the first withstand voltage, upon receiving the logic signal.

10 Claims, 3 Drawing Sheets

SEMICONDUCTOR INTEGRATED CIRCUIT

CROSS-REFERENCE TO RELATED APPLICATION

This application is based upon and claims the benefit of priority of the prior Japanese Patent Application No. 2019-041694, filed on Mar. 7, 2019, the entire contents of which are incorporated herein by reference.

BACKGROUND OF THE INVENTION

1. Field of the Invention

The embodiment discussed herein is related to a semiconductor integrated circuit including a voltage-controlled semiconductor power switch element that drives a coil load such as an ignition coil of an ignition system of a vehicular internal combustion engine.

2. Background of the Related Art

An ignition system is used for vehicular internal combustion engines that use gasoline as fuel. In this system, combustion is achieved by igniting mixture gas of fuel filling a combustion chamber of an internal combustion engine and air at predetermined timing.

FIG. 3 illustrates a configuration example of a common ignition system.

This ignition system includes an igniter 100, an ignition coil 200 including a primary coil L1 and a secondary coil L2, and a spark plug 300. One terminal of each of the primary coil L1 and the secondary coil L2 of the ignition coil 200 is connected to a positive terminal of a battery 500 via a switch 400, and a negative terminal of the battery 500 is connected to a chassis of a corresponding vehicle. Examples of the switch 400 include an accessory switch, a relay switch disposed in an electric component including the igniter 100, and a fuse.

The other terminal of the primary coil L1 of the ignition coil 200 is connected to an output terminal OUT of the igniter 100, and an input terminal IN of the igniter 100 is connected to an engine control unit (ECU: Electronic Control Unit) 600. The igniter 100 also includes a ground terminal GND and is connected to the negative terminal of the battery 500. The other terminal of the secondary coil L2 of the ignition coil 200 is connected to a center electrode of the spark plug 300, and a ground electrode of the spark plug 300 is screwed to a head cover of a corresponding internal combustion engine and is electrically grounded.

The igniter 100 includes a voltage-controlled semiconductor power switch element that is connected between the output terminal OUT and the ground terminal GND and that performs a switching operation. In the example in FIG. 3, an insulated gate bipolar transistor (IGBT) 101 is used as the voltage-controlled semiconductor power switch element. Alternatively, a metal-oxide-semiconductor field-effect transistor (MOSFET) may be used as the voltage-controlled semiconductor power switch element. The IGBT 101 has a collector connected to the output terminal OUT, a gate connected to the input terminal IN via a gate resistor 102, and an emitter connected to the ground terminal GND.

The igniter 100 also includes a control circuit 103 that is disposed between the gate and the emitter of the IGBT 101 and that protects the IGBT 101. This control circuit 103 uses an input voltage Vin supplied to the gate of the IGBT 101 as its power supply voltage and operates only while the control circuit 103 is being supplied with the input voltage Vin that turns on the IGBT 101. The igniter 100 also includes a clamp diode 104 that is disposed between the collector and the gate of the IGBT 101 for protection from a counter electromotive voltage of the ignition coil 200. In addition, the igniter 100 includes a diode 105 that is disposed between the input terminal IN and the emitter of the IGBT 101 for protection from electrostatic discharge.

The engine control unit 600 includes an IGBT drive circuit 601 that is connected to the input terminal IN of the igniter 100 and that drives the IGBT 101. The engine control unit 600 also includes a plurality of integrated circuits (ICs) 602 and 603 that are needed to control the internal combustion engine. These ICs 602 and 603 are processors used for signal processing relating to control of the ignition timing, control of a fuel injection apparatus, control of an air intake and exhaust system, control of a valve mechanism, and control of starting based on a starter, an immobilizer, etc.

This ignition system will be described, assuming that the switch 400 has been turned on and that the engine control unit 600 and the ignition coil 200 have been supplied with a battery voltage VB of the battery 500. In this state, when the IGBT drive circuit 601 supplies the input voltage Vin, which is for example 5 volts (V), to the input terminal IN of the igniter 100, this input voltage Vin is applied to the gate of the IGBT 101 via the gate resistor 102. Consequently, the IGBT 101 is turned on, and a current flows through the primary coil L1 of the ignition coil 200. Next, when the input voltage Vin drops to 0 V at certain timing, the IGBT 101 is turned off, and the primary coil L1 of the ignition coil 200 is cut off. Consequently, a high voltage occurs across the secondary coil L2 of the ignition coil 200, and this high voltage is supplied to the spark plug 300. As a result, a spark discharge is caused at the plug gap, and the mixture gas in the combustion chamber is ignited. Subsequently, turning on and off of the IGBT 101 is repeated, and a spark discharge is caused intermittently.

The control circuit 103 operates by using the input voltage Vin as its power supply voltage and monitors a current that flows through the IGBT 101, to prevent this current from exceeding a predetermined current value. To sense this current flowing through the IGBT 101, a configuration obtained by combining a main IGBT and a sense IGBT is commonly used as the IGBT 101 (see Japanese Laid-open Patent Publication No. 2016-017512, for example). While the sense IGBT has the same configuration as that of the main IGBT, the sense IGBT has a smaller size than that of the main IGBT. In addition, the sense IGBT has a gate connected to that of the main IGBT and has a collector connected to that of the main IGBT. In this way, when a current flows through the main IGBT, division of the current is achieved, and a current approximately proportional to the current flowing through the main IGBT flows through the sense IGBT. Thus, by monitoring the current flowing through the sense IGBT, the control circuit 103 is able to sense the current flowing through the main IGBT indirectly. When the control circuit 103 senses that the current flowing through the main IGBT has exceeded the predetermined value, the control circuit 103 limits the current flowing through the main IGBT by dropping the gate voltage applied to the IGBT 101. Consequently, the IGBT 101 is protected from being destroyed.

However, in the conventional ignition system, if the switch supplying the battery voltage VB is unexpectedly cut off while the IGBT is in a turn-on state, a circuit other than the igniter, the circuit being disposed downstream of the switch, could be destroyed. Namely, if the switch is suddenly cut off while the IGBT is in a turn-on state, the ignition coil, which is an inductive load, generates counter electromotive force, and a high voltage occurs across the primary coil. In this case, the polarity of this generated voltage at the igniter-side terminal opposite to the power supply line is positive. In addition, while a current flows through the ground line via the turned-on IGBT of the igniter from the primary coil, a part of this current flows through the IGBT drive circuit of the engine control unit via the electrostatic discharge protection diode of the igniter from the ground line as a reflux current. In addition, the remaining reflux current flowing through the ground line flows through the ground terminals of the ICs of the engine control unit. Namely, depending on the timing at which the switch is cut off, since a high voltage of a reverse polarity is applied to the power supply line and the ground line, the engine control unit could be instantaneously destroyed.

SUMMARY OF THE INVENTION

In one aspect of the embodiment, there is provided a semiconductor integrated circuit for driving an inductive load. The semiconductor integrated circuit includes: a semiconductor power switch element configured to drive the inductive load; a load current sensing circuit configured to sense a load current of the inductive load; a logic circuit configured to output a logic signal responsive to the load current sensing circuit sensing a drop in the load current while the semiconductor power switch element is in a turn-on state; a gate voltage pull-down circuit configured to pull down a gate voltage of the semiconductor power switch element upon receiving the logic signal; a clamp diode disposed between a gate of the semiconductor power switch element and a high-potential terminal connected to the inductive load; and a clamp withstand voltage drop circuit configured to switch a first withstand voltage of the clamp diode to a second withstand voltage upon receiving the logic signal, the second withstand voltage being lower than the first withstand voltage.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, an embodiment will be described in detail with reference to drawings by using, as an example, a case where a semiconductor integrated circuit is applied to an igniter of an ignition system of a vehicular internal combustion engine. In the example in FIG. 1, an IGBT will be used as a voltage-controlled semiconductor power switch element of the igniter. However, a power MOSFET may alternatively be used.

Figure 1:
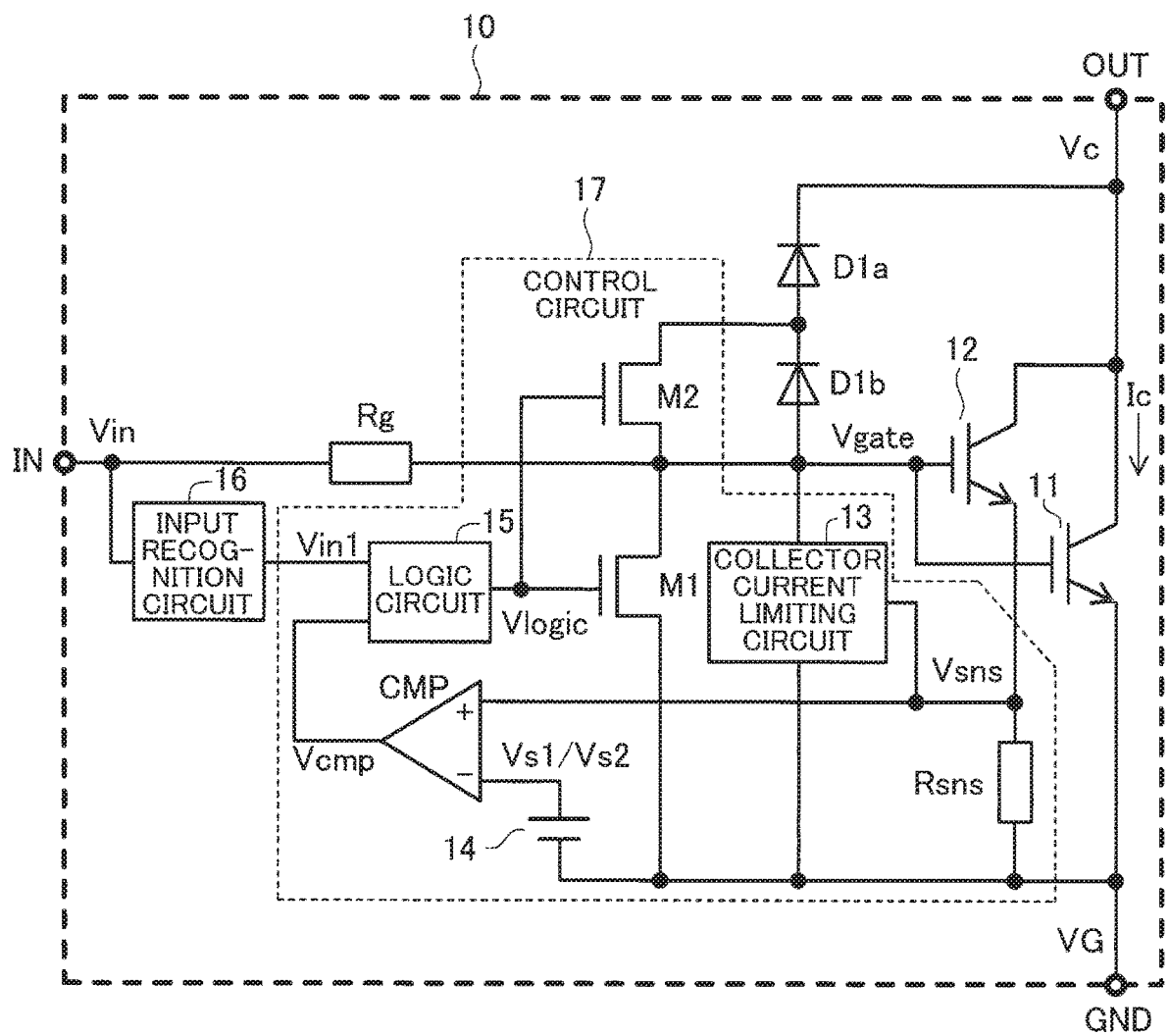
FIG. 1 is a circuit diagram illustrating a configuration example of an igniter according to an embodiment.
Figure 2:
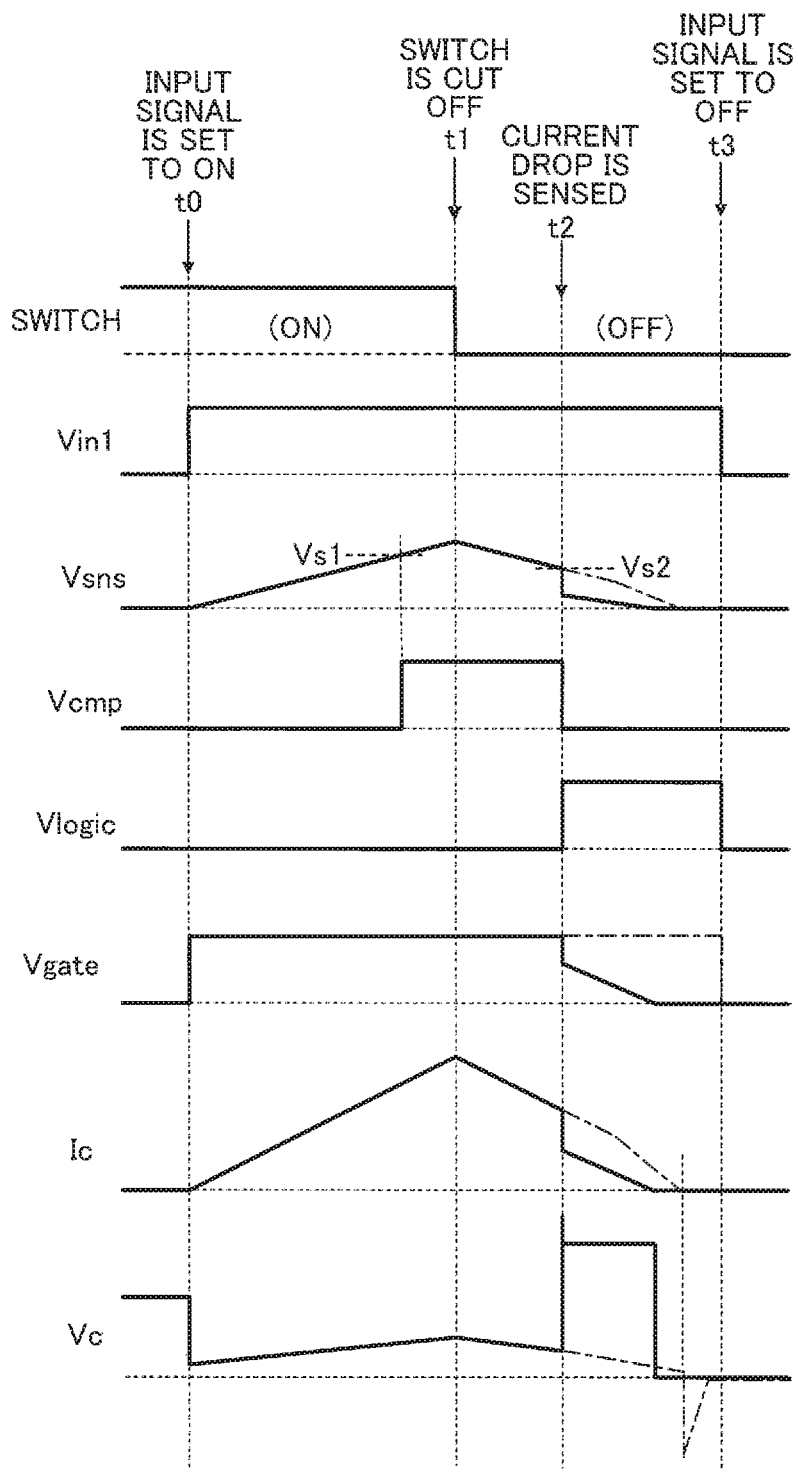
FIG. 2 is a time chart illustrating an operation of the igniter.

FIG. 1 is a circuit diagram illustrating a configuration example of an igniter according to an embodiment, and FIG. 2 is a time chart illustrating an operation of the igniter.

The igniter 10 includes a main IGBT 11 that constitutes a voltage-controlled semiconductor power switch element and a sense IGBT 12 that indirectly senses a collector current Ic, which is a load current flowing through the main IGBT 11. The main IGBT 11 and the sense IGBT 12 have collectors connected to an output terminal OUT and have gates connected to one terminal of a gate resistor Rg, and the other terminal of the gate resistor Rg is connected to an input terminal IN. In this way, when an input voltage Vin is inputted to the input terminal IN, a gate voltage Vgate is applied to the gates of the main IGBT 11 and the sense IGBT 12.

The main IGBT 11 has an emitter connected to a ground terminal GND, and the sense IGBT 12 has an emitter connected to one terminal of a current sensing resistor Rsns. The other terminal of the current sensing resistor Rsns is connected to the ground terminal GND. In this way, a current flowing through the sense IGBT 12 is converted into a sensed voltage Vsns by the current sensing resistor Rsns and is used as a sensed signal. This sensed signal is used to limit the collector current Ic or sense loss of a battery voltage after a battery-side switch is unexpectedly cut off.

A connection point of the emitter of the sense IGBT 12 and the current sensing resistor Rsns is connected to an input terminal of a collector current limiting circuit 13 and to a non-inverting input terminal of a hysteresis comparator CMP and supplies the sensed voltage Vsns converted by the current sensing resistor Rsns. An inverting input terminal of the hysteresis comparator CMP is connected to a positive terminal of a reference voltage source 14, and a negative terminal of the reference voltage source 14 is connected to the ground terminal GND. The reference voltage source 14 outputs a current conduction sensing level Vs1 and a current drop sensing level Vs2 (Vs1>Vs2) as reference voltages of the hysteresis comparator CMP. The hysteresis comparator CMP has an output terminal connected to one input terminal of a logic circuit 15 and supplies a voltage Vcmp as a comparison result. When the sensed signal obtained by the current sensing resistor Rsns is below a reference voltage, the voltage Vcmp outputted from the hysteresis comparator CMP is supplied to one input terminal of the logic circuit 15 as a low current sensing signal.

The input terminal IN is connected to an input terminal of an input recognition circuit 16. An output terminal of the input recognition circuit 16 is connected to the other input terminal of the logic circuit 15 and supplies an input recognition voltage Vin1 indicating input of the input voltage Vin. The logic circuit 15 has an output terminal connected to gates of semiconductor switches M1 and M2 and supplies a logic output voltage Vlogic as a logic signal. The semiconductor switches M1 and M2 are N-channel MOSFETs. The semiconductor switch M1 has a drain connected to the gates of the main IGBT 11 and the sense IGBT 12 and a source connected to the ground terminal GND. When turned on, the semiconductor switch M1 drops the gate voltage Vgate to the ground level. Namely, the semiconductor switch M1 constitutes a gate voltage pull-down circuit.

The collectors of the main IGBT 11 and the sense IGBT 12 are connected to a cathode of a clamp diode D1a, and an anode of the clamp diode D1a is connected to a cathode of a clamp diode D1b. An anode of the clamp diode D1b is connected to the gates of the main IGBT 11 and the sense IGBT 12.

A connection point of the anode of the clamp diode D1a and the cathode of the clamp diode D1b is connected to a drain of the semiconductor switch M2, and a source of the semiconductor switch M2 is connected to the anode of the clamp diode D1b. In this way, when the semiconductor switch M2 is off, the collector-gate voltages of the main IGBT 11 and the sense IGBT 12 are clamped by a total breakdown (withstand) voltage of the clamp diodes D1a and D1b. Since both terminals of the clamp diode D1b are short-circuited when the semiconductor switch M2 is on, the collector-gate voltages of the main IGBT 11 and the sense IGBT 12 are clamped by a withstand voltage of the clamp diode D1a. To achieve high withstand voltages, the clamp diodes D1a and D1b are structured by connecting a plurality of Zener diodes in series. For example, a total withstand voltage of the clamp diodes D1a and D1b is about 400 V to 500 V. In addition, the withstand voltages of the clamp diodes D1a and D1b are considered as a system such as one represented in FIG. 3 and are set as appropriate. However, it is preferable that the withstand voltage of the clamp diode D1b be equal to or less than that of the semiconductor switch M2. In addition, it is preferable that the withstand voltage of the clamp diode D1b be 50 V or less.

The collector current limiting circuit 13 receives the sensed voltage Vsns. When the sensed voltage Vsns exceeds a predetermined threshold, namely, when the collector current Ic exceeds a predetermined value, the collector current limiting circuit 13 drops the gate voltage Vgate and limits the collector current Ic, to prevent the collector current Ic from rising.

Figure 3:
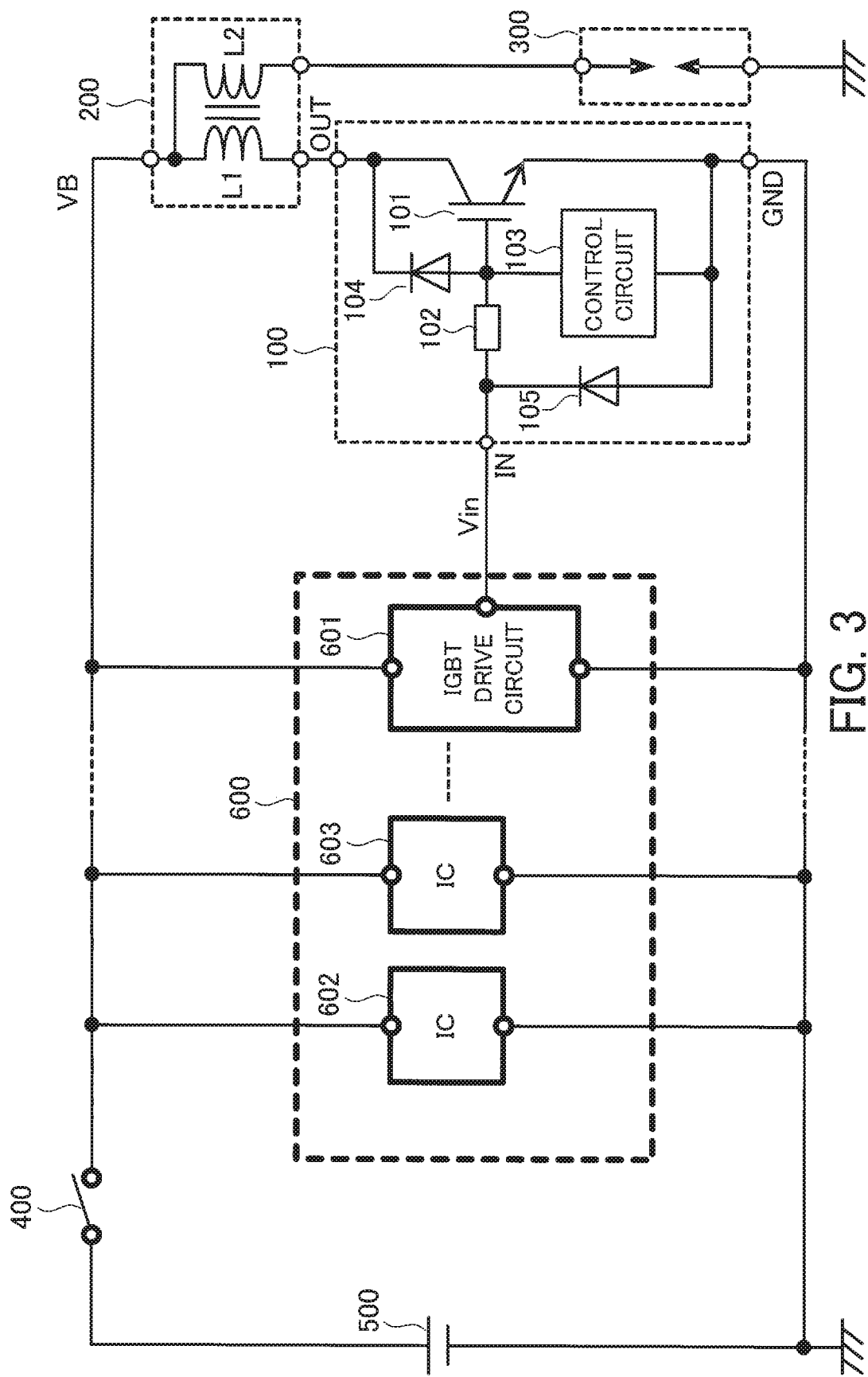
FIG. 3 illustrates a configuration example of a common ignition system.

In this igniter 10, the current sensing resistor Rsns, the collector current limiting circuit 13, the hysteresis comparator CMP, the reference voltage source 14, the logic circuit 15, and the semiconductor switches M1 and M2 constitute a control circuit 17 corresponding to the control circuit 103 of the igniter 100 illustrated in FIG. 3. In addition, the igniter 10 is a one-chip igniter obtained by forming the main IGBT 11, the sense IGBT 12, the gate resistor Rg, the clamp diodes D1a and D1b, the input recognition circuit 16, and the control circuit 17 on a single semiconductor chip.

Herein, the sense IGBT 12, the current sensing resistor Rsns, the hysteresis comparator CMP, and the reference voltage source 14 of the igniter 10 constitute a load current sensing circuit. It is assumed that, when this load current sensing circuit senses that a current flowing through the sense IGBT 12, the current obtained by dividing the load current that flows when the main IGBT 11 is turned on, has dropped, namely, when the load current sensing circuit senses that the sensed voltage Vsns obtained by the current sensing resistor Rsns has dropped, the load current sensing circuit determines that the battery voltage of the power supply line has been lost.

The semiconductor switch M1 is turned on when the logic circuit 15 outputs the logic output voltage Vlogic as a logic signal in response to the input recognition voltage Vin1 and the low current sensing signal. As a result, since the gate voltage Vgate of the main IGBT 11 is pulled down, the main IGBT 11 is turned off rapidly.

When receiving the logic output voltage Vlogic as a logic signal, the semiconductor switch M2 is turned on and drops the clamp withstand voltage by short-circuiting both terminals of the clamp diode D1b. As a result, since a collector voltage Vc, which rises when the main IGBT 11 is rapidly turned off, is clamped by the clamp diode D1a, the collector voltage Vc will not exceed the withstand voltage of the clamp diode D1a. In this operation, since the current flowing through the clamp diode D1a charges the gate capacitance of the main IGBT 11, the gate voltage Vgate of the main IGBT 11 drops more gradually, and the main IGBT 11 cuts off the collector current Ic more gradually.

Next, an operation performed when this igniter 10 is applied to the ignition system illustrated in FIG. 3 will be described with reference to FIG. 2. FIG. 2 illustrates, from top to bottom, the switch of the power supply line, the input recognition voltage Vin1, the sensed voltage Vsns, the voltage Vcmp outputted by the hysteresis comparator CMP, the logic output voltage Vlogic, the gate voltage Vgate, and the collector current Ic and the collector voltage Vc of the main IGBT 11.

First, the igniter 10 has been used while the switch is on. In this state, when the input voltage Vin is at a low (L) level that turns off the main IGBT 11, both the input recognition voltage Vin1 and the gate voltage Vgate are also at an L level. In addition, since the collector current Ic represents 0, the sensed voltage Vsns and the voltage Vcmp of the hysteresis comparator CMP are also at an L level. The collector voltage Vc of the main IGBT 11 is equal to the battery voltage VB.

At time t0, when the input voltage Vin is inputted from the IGBT drive circuit of the engine control unit to the input terminal IN of the igniter 10, the input recognition voltage Vin1 and the gate voltage Vgate rise to a high (H) level. Since the main IGBT 11 and the sense IGBT 12 are consequently turned on, the collector voltage Vc rapidly drops. By contrast, since the load of the igniter 10 is an inductive ignition coil, the collector current Ic begins to rise gradually.

Next, when the sensed voltage Vsns exceeds the current conduction sensing level Vs1 as the collector current Ic gradually rises, the hysteresis comparator CMP outputs an H-level voltage Vcmp.

At time t1, when the switch of the power supply line is cut off for some reason, the collector current Ic begins to drop gradually, and accordingly, the sensed voltage Vsns also begins to drop gradually.

At time t2, when the sensed voltage Vsns falls below the current drop sensing level Vs2, the hysteresis comparator CMP outputs an L-level voltage Vcmp. As a result, the logic circuit 15 determines that the current has been dropped by the cutting off of the power supply line and outputs an H-level logic output voltage Vlogic at the time t2.

When the logic circuit 15 outputs this H-level logic output voltage Vlogic, since the semiconductor switch M1 is turned on, the gate voltage Vgate is pulled down in a moment. As a result, the main IGBT 11 is turned off, the collector current Ic drops instantaneously, and the collector voltage Vc jumps in a moment. In this operation, at the same time, since the semiconductor switch M2 is also turned on and the withstand voltages of the clamp diodes D1a and D1b are switched to the withstand voltage of the clamp diode D1a alone, the collector voltage Vc is clamped by the withstand voltage of the clamp diode D1a, and the current flowing through the clamp diode D1a rapidly rises. When this current flowing through the clamp diode D1a is supplied to the gate of the main IGBT 11, since the drop of the gate voltage Vgate becomes gradual, the collector current Ic and the sensed voltage Vsns also begins to drop gradually. Next, when the collector current Ic reaches 0, the collector voltage Vc also drops to 0.

At time t3, when an L-level input voltage Vin is inputted to the input terminal IN, the input recognition voltage Vin1 and the gate voltage Vgate drops to an L-level, and the logic circuit 15 outputs an L-level logic output voltage Vlogic.

The individual curves indicated by alternate long and short dash lines in FIG. 2 represent, for reference, behaviors of the gate voltage Vgate, the sensed voltage Vsns, the collector current Ic, and the collector voltage Vc of the conventional igniter. Namely, when the power supply line is cut off, the sensed voltage Vsns, the collector current Ic, and the collector voltage Vc begins to drop gradually. When the collector current Ic drops to 0, the polarity of the collector voltage Vc is inverted, and a negative voltage occurs. In this state, since the gate voltage Vgate remains at the H level and the main IGBT 11 is in a turn-on state, regarding the ignition coil and the main IGBT 11, the power supply line becomes negative, and the ground line connected to the emitter of the main IGBT 11 becomes positive. As a result, since a voltage of a reverse polarity is applied to the power supply line and the ground line, the engine control unit connected to these lines could be destroyed.

In the case of the semiconductor integrated circuit having the above configuration, even if the power supply line is cut off while the semiconductor power switch element is in a turn-on state, when the load current disappears, the voltage at the high-potential terminal of the semiconductor power switch element also disappears. Namely, the semiconductor integrated circuit has an advantage in that no reflux current will occur.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor integrated circuit for driving an inductive load, the semiconductor integrated circuit comprising:
    a semiconductor power switch element configured to drive the inductive load;
    a load current sensing circuit configured to sense a load current of the inductive load;
    a logic circuit configured to output a logic signal responsive to the load current sensing circuit sensing a drop in the load current while the semiconductor power switch element is in a turn-on state;
    a gate voltage pull-down circuit configured to pull down a gate voltage of the semiconductor power switch element upon receiving the logic signal;
    a clamp diode disposed between a gate of the semiconductor power switch element and a high-potential terminal connected to the inductive load; and
    a clamp withstand voltage drop circuit configured to switch a first withstand voltage of the clamp diode to a second withstand voltage upon receiving the logic signal, the second withstand voltage being lower than the first withstand voltage.

2. The semiconductor integrated circuit according to claim 1, wherein
    the gate of the semiconductor power switch element has a turn-on control voltage applied thereto, which supplies power to the load current sensing circuit, the logic circuit, the gate voltage pull-down circuit, and the clamp withstand voltage drop circuit.

3. The semiconductor integrated circuit according to claim 1, wherein the load current sensing circuit includes
    a current sensing switch element that performs current division to obtain a current proportional to the load current,
    a current sensing resistor that converts the current obtained by the current sensing switch element into a voltage, to thereby output a sensed signal, and
    a hysteresis comparator that compares the sensed signal with a reference voltage and outputs a low current sensing signal when the sensed signal is lower than the reference voltage.

4. The semiconductor integrated circuit according to claim 1, wherein the gate voltage pull-down circuit includes a pull-down switch element that is connected to the gate of the semiconductor power switch element and a low potential terminal of the semiconductor power switch element and that turns on upon receiving the logic signal.

5. The semiconductor integrated circuit according to claim 1, wherein the semiconductor integrated circuit is an igniter, and the inductive load driven by the semiconductor power switch element is an ignition coil.

6. The semiconductor integrated circuit according to claim 1, wherein the semiconductor integrated circuit is a one-chip igniter in which the semiconductor power switch element, the load current sensing circuit, the logic circuit, the gate voltage pull-down circuit, the clamp diode, and the clamp withstand voltage drop circuit are formed on a single semiconductor chip.

7. The semiconductor integrated circuit according to claim 1, wherein
    the clamp diode includes a first clamp diode and a second clamp diode connected in series, the serially-connected first and second clamp diodes being disposed between the gate of the semiconductor power switch element and a high-potential terminal connected to the inductive load, and
    the clamp withstand voltage drop circuit is configured to switch a first withstand voltage between the gate and the high-potential terminal of the semiconductor power switch element, which corresponds to a total withstand voltage of the first and second clamp diodes, to a second withstand voltage, which corresponds to a withstand voltage of the first clamp diode, upon receiving the logic signal, the second withstand voltage being lower than the first withstand voltage.

8. The semiconductor integrated circuit according to claim 7, wherein
    each of the first clamp diode and the second clamp diode has a cathode and an anode, the cathode of the first clamp diode being connected to the high potential terminal, the anode of the first clamp diode being connected to the cathode of the second clamp diode, and the anode of the second clamp diode being connected to the gate of the semiconductor power switch element, and
    the clamp withstand voltage drop circuit includes a semiconductor switch having a drain connected to the cathode of the second clamp diode and a source connected to the anode of the second clamp diode.

9. A semiconductor integrated circuit for driving an inductive load, the semiconductor integrated circuit comprising:
    a semiconductor power switch element configured to drive the inductive load;
    a load current sensing circuit configured to sense a load current of the inductive load;

a logic circuit configured to output a logic signal responsive to the load current sensing circuit sensing a drop in the load current while the semiconductor power switch element is in a turn-on state;

a gate voltage pull-down circuit configured to pull down a gate voltage of the semiconductor power switch element upon receiving the logic signal;

a clamp diode disposed between a gate of the semiconductor power switch element and a high-potential terminal connected to the inductive load; and a clamp withstand voltage drop circuit configured to switch a first withstand voltage of the clamp diode to a second withstand voltage upon receiving the logic signal, the second withstand voltage being lower than the first withstand voltage, wherein the load current sensing circuit includes a current sensing switch element that performs current division to obtain a current proportional to the load current, a current sensing resistor that converts the current obtained by the current sensing switch element into a voltage, to thereby output a sensed signal, and a hysteresis comparator that compares the sensed signal with a reference voltage and outputs a low current sensing signal when the sensed signal is lower than the reference voltage, and wherein the logic circuit outputs the logic signal upon receiving an input signal that turns on the semiconductor power switch element and the low current sensing signal.

10. A semiconductor integrated circuit for driving an inductive load, the semiconductor integrated circuit comprising:

a semiconductor power switch element configured to drive the inductive load;

a load current sensing circuit configured to sense a load current of the inductive load;

a logic circuit configured to output a logic signal responsive to the load current sensing circuit sensing a drop in the load current while the semiconductor power switch element is in a turn-on state;

a gate voltage pull-down circuit configured to pull down a gate voltage of the semiconductor power switch element upon receiving the logic signal;

a clamp diode disposed between a gate of the semiconductor power switch element and a high-potential terminal connected to the inductive load; and a clamp withstand voltage drop circuit configured to switch a first withstand voltage of the clamp diode to a second withstand voltage upon receiving the logic signal, the second withstand voltage being lower than the first withstand voltage, wherein the clamp diode includes a plurality of diodes connected in series, and the clamp withstand voltage drop circuit includes a short-circuit switch element that is connected in parallel to a part of the plurality of diodes and that turns on upon receiving the logic signal.

* * * * *